United States Patent [19]

Park

[11] Patent Number: 5,663,102
[45] Date of Patent: Sep. 2, 1997

[54] METHOD FOR FORMING MULTI-LAYERED METAL WIRING SEMICONDUCTOR ELEMENT USING CMP OR ETCH BACK

[75] Inventor: Nae Hak Park, Seoul, Rep. of Korea

[73] Assignee: LG Semicon Co., Ltd., Chungcheongbuk-do, Rep. of Korea

[21] Appl. No.: 688,676

[22] Filed: Jul. 29, 1996

Related U.S. Application Data

[63] Continuation of Ser. No. 437,865, May 9, 1995, abandoned.

[30] Foreign Application Priority Data

May 10, 1994 [KR] Rep. of Korea ............... 10217/1994

[51] Int. Cl.$^6$ .................................................. H01L 21/28
[52] U.S. Cl. ...................... 438/626; 438/633; 438/645
[58] Field of Search ................................. 437/189, 192, 437/194, 195, 203, 228; 156/636.1

[56] References Cited

U.S. PATENT DOCUMENTS

| 4,789,648 | 12/1988 | Chow et al. | 437/225 |
| 4,966,865 | 10/1990 | Welch et al. | 257/752 |
| 5,262,354 | 11/1993 | Cote et al. | 437/194 |
| 5,272,101 | 12/1993 | Forouhi et al. | 437/192 |
| 5,286,675 | 2/1994 | Chen et al. | 437/203 |
| 5,393,703 | 2/1995 | Olowolafe et al. | 437/192 |
| 5,429,989 | 7/1995 | Fiordalice et al. | 437/203 |

FOREIGN PATENT DOCUMENTS

| 60-115221 | 6/1985 | Japan . |
| 05144768 | 6/1993 | Japan . |

*Primary Examiner*—John Niebling
*Assistant Examiner*—Thomas G. Bilodeau
*Attorney, Agent, or Firm*—Finnegan, Henderson, Farabow, Garrett & Dunner, L.L.P.

[57] ABSTRACT

A method for forming a Damascene structured multi-layered metal wiring for a semiconductor element, which includes the steps for forming a first insulating layer on the surface of a semiconductor substrate, forming a lower metal wiring pattern on the first insulating layer, forming a second insulating layer on the first insulating layer and the lower metal wiring pattern, forming contacts by subjecting the second insulating layer to etching, successively depositing first and second upper metals over the second insulating layer and the contact, subjecting the second upper metal to etching until the first upper metal is exposed, and forming an upper metal wiring pattern having a double metal structure by subjecting the first upper metal to etching until the second insulating layer is exposed. The upper wiring layer is preferably formed of aluminum deposited by a sputtering method and tungsten deposited by a chemical vapor deposition method.

18 Claims, 4 Drawing Sheets

METHOD FOR FORMING MULTI-LAYERED METAL WIRING SEMICONDUCTOR ELEMENT USING CMP OR ETCH BACK

This application is a continuation, of application Ser. No. 08/437,865, filed May 9, 1995, now abandoned.

BACKGROUND OF THE INVENTION

This invention relates to a method for forming multi-layered metal wiring for a semiconductor element, and more particularly to a method for forming multi-layered metal wiring of aluminum and tungsten, which is suitable to a Damascene structure.

FIGS. 1a–1d show a conventional method for forming multi-layered metal wiring for a semiconductor element.

Referring to FIG. 1a, a lower metal wiring layer 13 is formed by depositing a first insulating layer 12 on a semiconductor substrate 11, and depositing lower metal on the insulating layer 12 and subjecting it to patterning to form a lower metal wiring pattern.

Referring to FIG. 1b, a thick second insulating layer 14 is formed on the first insulating layer 12 having the lower metal wiring pattern 13 formed thereon.

Parts of the second insulating layer 14 are subjected to a photoetching process, and are etched to a predetermined depth using a first photo-mask to form channels for the upper metal wiring pattern to be formed in a subsequent step.

Then, contact portions 15 are formed by etching parts of the second insulating layer 14 to expose the lower metal wiring layer 13. This exposed portion of the lower metal wiring will make contact with the upper metal wiring pattern.

Referring to FIG. 1c, an upper metal layer 16 is deposited on the substrate, filling the channels and the contact portions 15. The upper metal layer 16 is formed of either aluminum deposited by a sputtering method or tungsten deposited by a chemical vapor deposition method.

Referring to FIG. 1d, an upper metal wiring pattern 17 is formed by subjecting the upper metal layer 16 either to an etch back process or to a chemical mechanical polishing process until the second insulating layer 14 is exposed. Thus, conventional multi-layered metal wiring for a semiconductor element can be formed.

The conventional method for forming multi-layered metal wiring for a semiconductor element has provided a Damascene structured upper metal wiring layer formed of a single metal layer of either aluminum or tungsten. When the Damascene structured upper metal wiring pattern is formed of aluminum, the contact opening can be developed, resulting in excess aluminum that can cause shorts.

When the Damascene structured upper metal wiring layer is formed of tungsten, the processing speed of the semiconductor element is reduced due to tungsten's resistance, which is 4 times greater than aluminum.

SUMMARY OF THE INVENTION

An object of this invention is to provide multilayered metal wiring for a semiconductor element and a method for forming semiconductor element multi-layered metal wiring which avoids contact openings and improves processing speed by providing a Damascene structured upper metal wiring pattern having multiple metal layers.

These and other objects and features of this invention can be achieved by providing a method for forming multi-layered metal wiring for a semiconductor element, including the steps of forming a first insulating layer on the surface of a semiconductor substrate, forming a lower metal wiring pattern on the first insulating layer, forming a second insulating layer on the first insulating layer and the lower metal wiring pattern, forming contact portions by etching portions of the second insulating layer, successively depositing first and second upper metals on the second insulating layer, including the contacts, etching the second upper metal until the first upper metal is exposed, and forming an upper wiring pattern comprised of at least two metals by etching the first upper metal until the second insulating layer is exposed.

DETAILED DESCRIPTION OF THE INVENTION

Figure 1A:
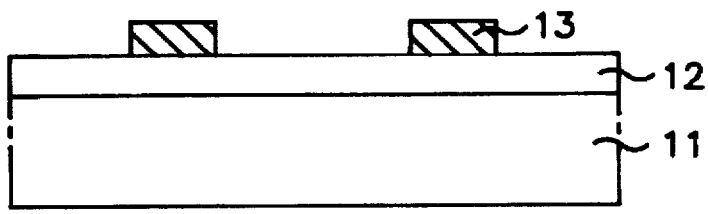
FIGS. 1a–1d show a conventional process for forming a Damascene structured multi-layered metal wiring for a semiconductor element.
Figure 1B:
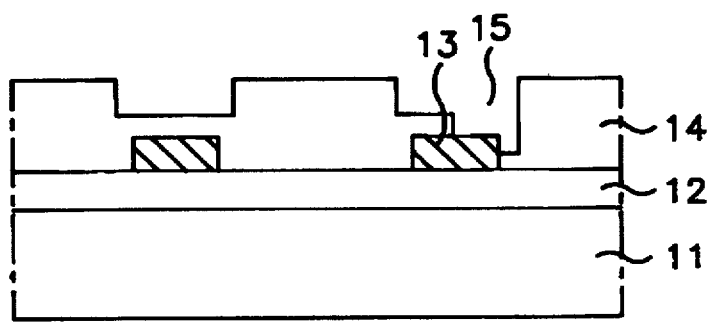
Figure 1C:
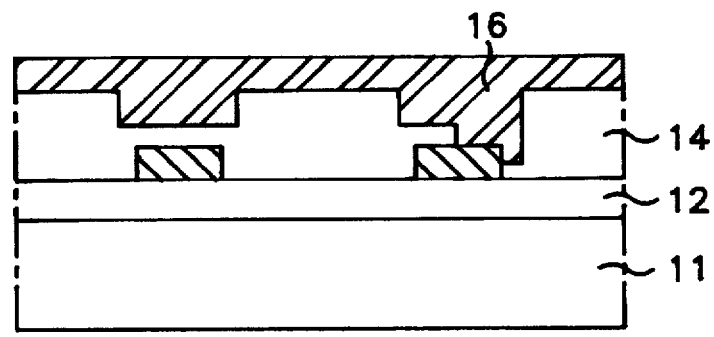
Figure 1D:
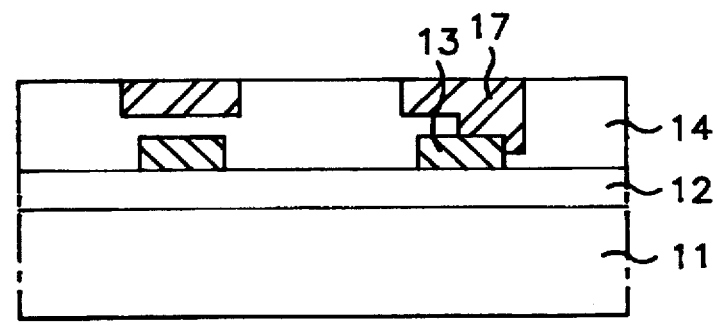
Figure 2A:
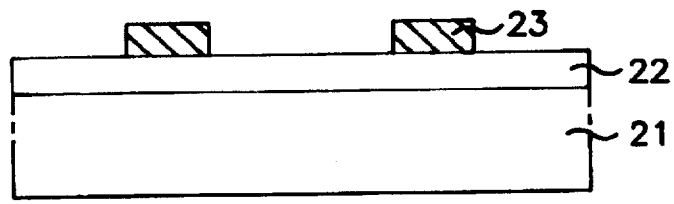
FIGS. 2a–2e show a process for forming a Damascene structured multi-layered metal wiring for a semiconductor element in accordance with one embodiment of this invention.
Figure 2B:
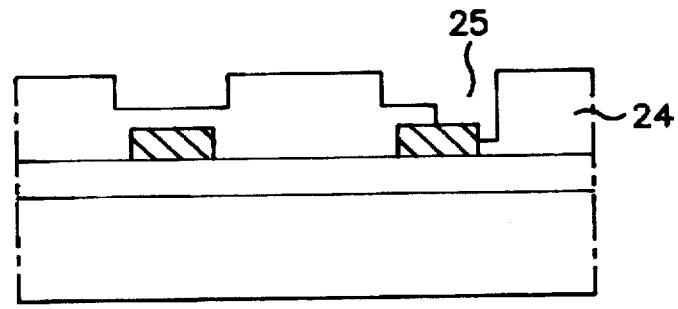

Referring to FIGS. 2a–2b, a lower metal wiring pattern 23 is formed by depositing a first insulating layer 22 on a semiconductor substrate 21, depositing a lower metal on the surface of the first insulating layer 22, and subjecting it to patterning to form the lower metal wiring pattern.

A thick, second insulating layer 24 is deposited on the first insulating layer 22 and the lower metal wiring pattern 23. Parts of the second insulating layer 24 are subjected to a photoetching process and etched to a predetermined thickness using a first photo-mask to form channels for upper metal wiring.

Then, contact portions 25 are formed in parts of the second insulating layer 24 to expose the lower metal wiring pattern 23.

Figure 2C:
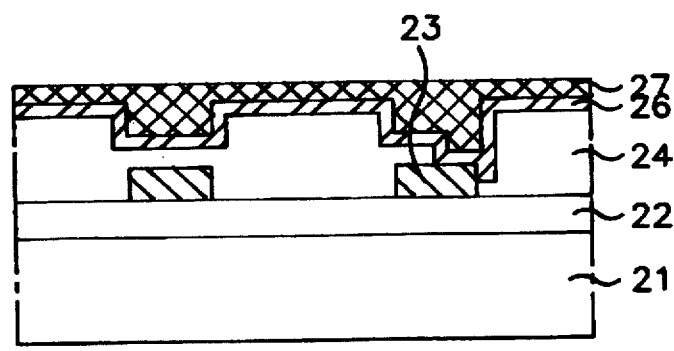

Referring to FIG. 2c, a first upper metal 26 is deposited on the substrate, filling the channels and the contact portions 25. A second upper metal 27 is then deposited on the first upper metal 26. The first upper metal 26 is formed of aluminum deposited by a sputtering method, and the second upper metal 27 is formed of tungsten deposited by a chemical vapor deposition method.

Preferably, the first upper metal 26 is deposited to a thickness of 500–2000 Å, and the second upper metal 27 is deposited to a thickness of 500–5000 Å.

Figure 2D:
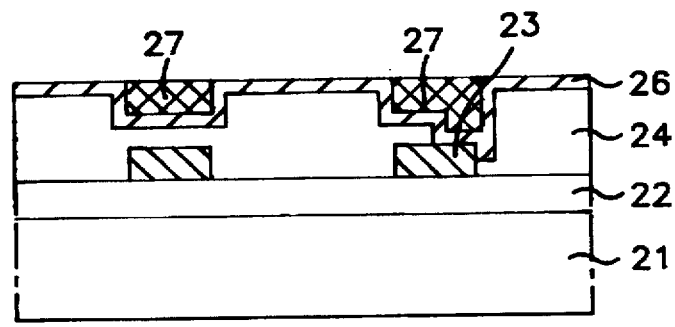
Figure 2E:
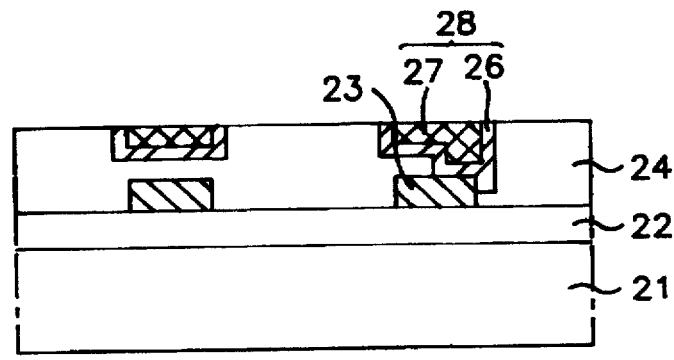

Referring to FIGS. 2d–2e, an upper metal wiring pattern 28 connected to the lower metal wiring pattern 23 at the contact portions 25, is formed of aluminum and tungsten by etching the second upper metal layer 27 until the first upper metal 26 is exposed and then subjecting the first upper metal 26 to a chemical mechanical polishing process until the second insulating layer 24 is exposed. Thus, the multi-layered metal wiring layer for a semiconductor element in accordance with one embodiment of this invention is completed.

Alternatively, in forming the upper metal wiring layer, the second upper metal may be subjected to a chemical mechanical polishing process, and the first upper metal may be subjected to an etch back process. Further, in forming the upper metal wiring layer, the second and first upper metals may be subjected to either an etch back process or a chemical mechanical polishing process.

Figure 3A:
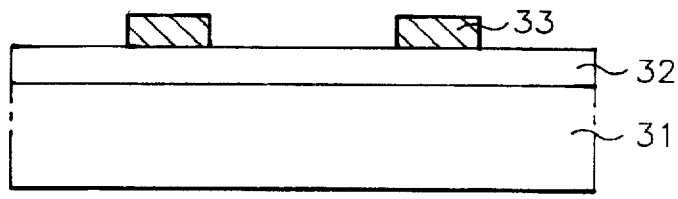
FIGS. 3a–3e show a process for forming a Damascene structured multi-layered metal wiring for a semiconductor element in accordance with another embodiment of this invention.
Figure 3B:
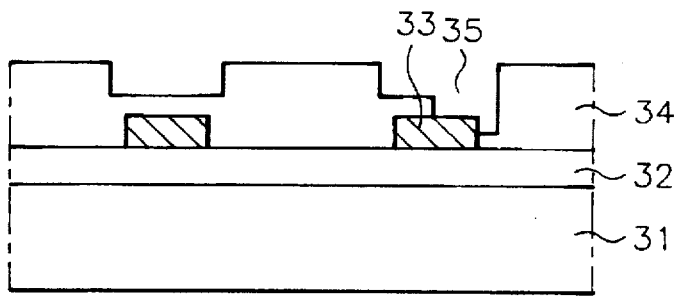
Figure 3C:
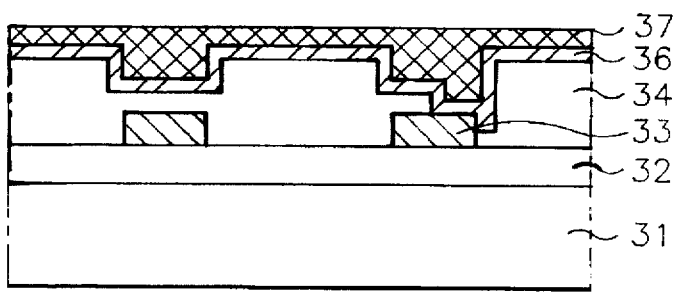
Figure 3D:
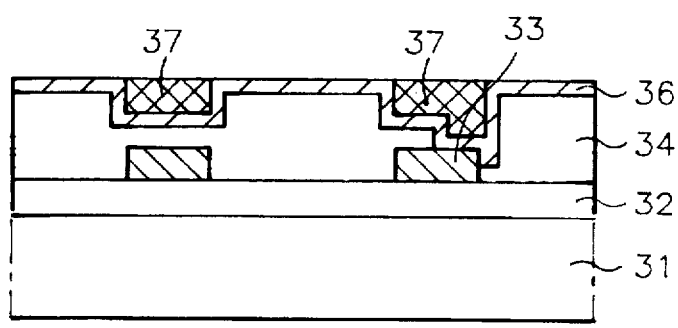
Figure 3E:
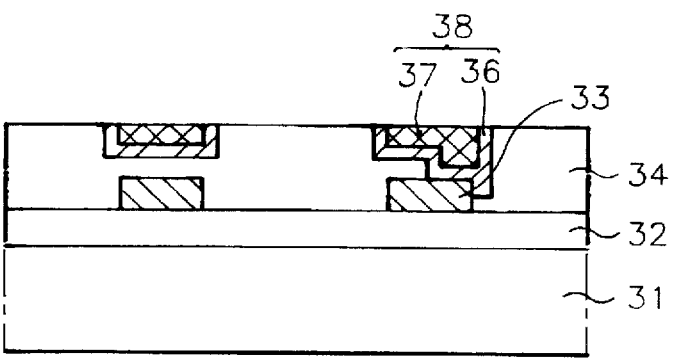

The method for forming a Damascene structured multi-layered metal wiring for a semiconductor element in accordance with the embodiment of the invention seen in FIGS.3a–3e is identical to the method shown in FIGS.2a–2e, except, as shown in FIG.3c, the first upper metal 36 is formed of tungsten deposited using a chemical vapor deposition method to a thickness of 500–2000 Å and the second upper metal 37 is formed of aluminum deposited using a sputtering method to a thickness of 500–5000 Å.

The method for forming a Damascene structured multi-layered metal wiring semiconductor element in accordance with the embodiment of the invention seen in FIGS.4a–4e is identical to the method shown in FIGS.2a–2e and FIGS.3a–3e respectively, except that, in this embodiment an upper metal wiring layer is formed of three layers.

Figure 4A:
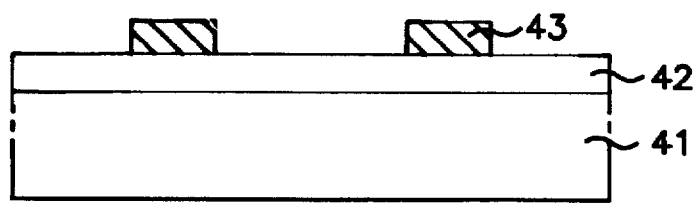
FIGS. 4a–4e show a process for forming a Damascene structured multi-layered metal wiring for a semiconductor element in accordance with another embodiment of this invention.
Figure 4B:
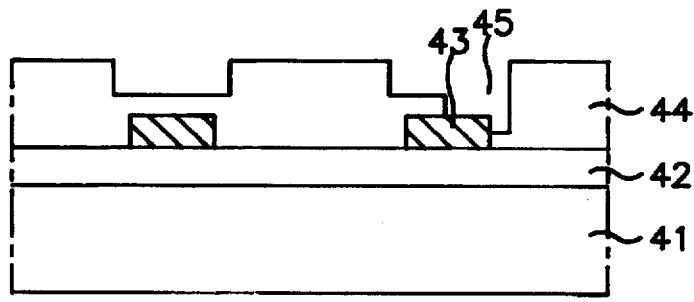
Figure 4C:
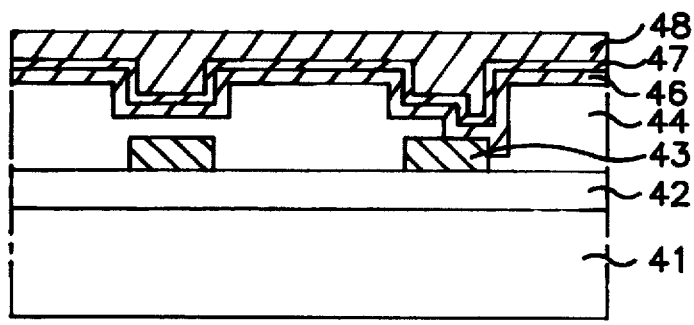

As shown in FIG.4c, a first upper metal 46 is formed of tungsten deposited using a chemical vapor deposition method to a thickness of 500–2000 Å, a second upper metal 47 is formed of aluminum deposited using a sputtering method to a thickness of 500–2000 Å, and a third upper metal 48 is formed of tungsten deposited by a chemical vapor deposition method to a thickness of 500–5000 Å.

Figure 4D:
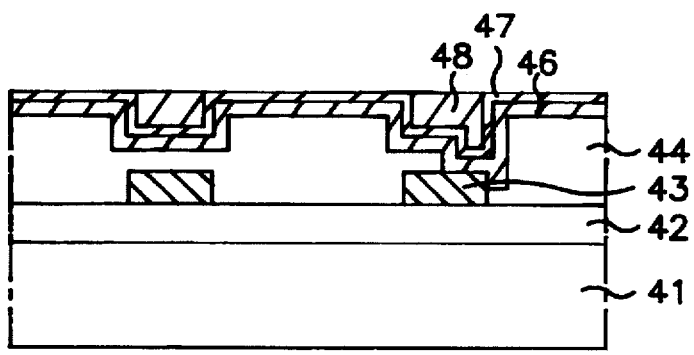
Figure 4E:
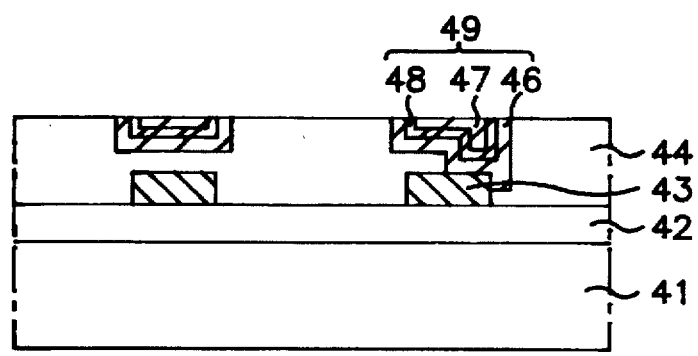

Referring to FIGS.4d–4e, an upper metal wiring pattern 49, of tungsten/aluminum/tungsten connected to the lower metal wiring pattern 43 through the contact portion 45, is formed by etching the second and the third upper metal layers 47 and 48 until the first upper metal 46 is exposed and subjecting the first upper metal 46 to a chemical mechanical polishing process until the second insulating layer 44 is exposed.

Alternatively, in forming the upper metal wiring pattern, the second and the third upper metals may be subjected to a chemical mechanical polishing process, and the first upper metal may be subjected to an etch back process. Further, in forming the upper metal wiring pattern, the first to the third upper metals may be subjected to either an etch back process or a chemical mechanical polishing process.

This invention having the foregoing structure is advantageous in that it can prevent shorts due to contact openings and improve the processing speed by reducing the resistance of a Damascene structured upper metal wiring pattern having multiple layers of tungsten and aluminum.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming a multi-layered metal wiring for a semiconductor element, the method comprising the steps of:

forming a first insulating layer on a surface of a semiconductor substrate;

forming a lower metal wiring pattern on the first insulating layer;

forming a second insulating layer on the first insulating layer and the lower metal wiring pattern;

forming contact portions in the second insulating layer;

successively depositing first and second upper metals over the contact portions and the second insulating layer;

removing portions of the second upper metal by subjecting said second upper metal to an etch back process until the first upper metal is exposed; and removing portions of the first upper metal by subjecting said first upper metal to a chemical mechanical polishing process until the second insulating layer is exposed, thereby to form an upper metal wiring pattern comprised of the first and second upper metals.

2. The method as claimed in claim 1, wherein the first upper metal is aluminum deposited by a sputtering method, and the second upper metal is tungsten deposited by a chemical vapor deposition method.

3. The method as claimed in claim 1, wherein the first upper metal is tungsten deposited by a chemical vapor deposition method, and the second upper metal is aluminum deposited by a sputtering method.

4. The method as claimed in claim 1, wherein the first upper metal is deposited to a thickness of 500–2000 Å and the second upper metal is deposited to a thickness of 500–5000 Å.

5. The method as claimed in claim 1, wherein the contact portions forming step includes, photoetching parts of the second insulating layer using a first photo-mask to define channels for the upper metal wiring pattern, and forming the contact portions by selectively photoetching portions of the second insulating layer to expose the lower metal wiring layer.

6. A method for forming multi-layered metal wiring for a semiconductor element comprising:

forming a first insulating layer on a semiconductor substrate;

forming a lower metal wiring pattern on the first insulating layer;

forming a second insulating layer on the first insulating layer;

forming contact portions in the second insulating layer;

successively depositing first, second, and third upper metals over the second insulating layer, including the contact portions;

removing portions of the second and the third upper metals by subjecting the second and third upper metal layer to an etch back process until the first upper metal is exposed; and forming an upper metal wiring pattern comprising three metals by removing portions of the first upper metal by subjecting the first upper metal to a chemical mechanical polishing process until the second insulating layer is exposed.

7. The method as claimed in claim 6, wherein the first upper metal is formed of tungsten deposited by a chemical vapor deposition method, the second upper metal is formed of aluminum deposited by a sputtering method, and the third upper metal is formed of tungsten deposited by a chemical vapor deposition method.

8. The method as claimed in claim 7, wherein the first upper metal is deposited to a thickness of 500–2000 Å, the second upper metal is deposited to a thickness of 500–2000 Å, and the third upper metal is deposited to a thickness of 500–5000 Å.

9. A method for forming a multi-layered metal wiring for a semiconductor element, the method comprising the steps of:

forming a first insulating layer on a surface of a semiconductor substrate;

forming a lower metal wiring pattern on the first insulating layer;

forming a second insulating layer on the first insulating layer and the lower metal wiring pattern;

forming contact portions in the second insulating layer;

successively depositing first and second upper metals over the contact portions and the second insulating layer;

removing portions of the second upper metal by subjecting said second upper metal to a chemical mechanical polishing process until the first upper metal is exposed; and removing portions of the first upper metal by subjecting said first upper metal to an etch back process until the second insulating layer is exposed, thereby to form an upper metal wiring pattern comprised of the first and second upper metals.

10. The method as claimed in claim 9, wherein the first upper metal is aluminum deposited by a sputtering method, and the second upper metal is tungsten deposited by a chemical vapor deposition method.

11. The method as claimed in claim 9, wherein the first upper metal is tungsten deposited by a chemical vapor deposition method, and the second upper metal is aluminum deposited by a sputtering method.

12. The method as claimed in claim 9, wherein the first upper metal is deposited to a thickness of 500–2000 Å and the second upper metal is deposited to a thickness of 500–5000 Å.

13. The method as claimed in claim 9, wherein the contact portions forming step includes, photoetching parts of the second insulating layer using a first photo-mask to define channels for the upper metal wiring pattern, and forming the contact portions by selectively photoetching portions of the second insulating layer to expose the lower metal wiring layer.

14. A method for forming a multi-layered metal wiring for a semiconductor element, the method comprising the steps of:

forming a first insulating layer on a surface of semiconductor substrate;

forming a lower metal wiring pattern on the first insulating layer;

forming a second insulating layer on the first insulating layer and the lower metal wiring pattern;

forming contact portions in the second insulating layer;

successively depositing first and second upper metals over the contact portions and the second insulating layer;

removing portions of the second upper metal by subjecting said second upper metal to a first chemical mechanical polishing process until the first upper metal is exposed; and removing portions of the first upper metal by subjecting said first upper metal to a second chemical mechanical polishing process separate from said first chemical mechanical polishing process until the second insulating layer is exposed, thereby to form an upper metal wiring pattern comprised of the first and second upper metals.

15. A method for forming multi-layered metal wiring for a semiconductor element comprising:

forming a first insulating layer on a semiconductor substrate;

forming a lower metal wiring pattern on the first insulating layer;

forming a second insulating layer on the first insulating layer;

forming contact portions in the second insulating layer;

successively depositing first, second, and third upper metals over the second insulating layer, including the contact portions;

removing portions of the second and the third upper metals by subjecting said second and third upper metals to a chemical mechanical polishing process until the first upper metal is exposed; and forming an upper metal wiring pattern comprising three metals by removing portions of the first upper metal by subjecting said first upper metal to an etch back process until the second insulating layer is exposed.

16. The method as claimed in claim 15, wherein the first upper metal is formed of tungsten deposited by a chemical vapor deposition method, the second upper metal is formed of aluminum deposited by a sputtering method, and the third upper metal is formed of tungsten deposited by a chemical vapor deposition method.

17. The method as claimed in claim 15, wherein the first upper metal is deposited to a thickness of 500–2000 Å, the second upper metal is deposited to a thickness of 500–2000 Å, and the third upper metal is deposited to a thickness of 500–5000 Å.

18. A method for forming multi-layered metal wiring for a semiconductor element comprising:

forming a first insulating layer on a semiconductor substrate;

forming a lower metal wiring pattern on the first insulating layer;

forming a second insulating layer on the first insulating layer;

forming contact portions in the second insulating layer;

successively depositing first, second, and third upper metals over the second insulating layer, including the contact portions;

removing portions of the second and the third upper metals by subjecting said second and third upper metal to a first chemical mechanical polishing process until the first upper metal is exposed; and forming an upper metal wiring pattern comprising three metals by removing portions of the first upper metal using a second chemical mechanical polishing process separate from said first chemical mechanical polishing process until the second insulating layer is exposed.

\* \* \* \* \*